US008567911B2

(12) United States Patent
Nystrom et al.

(10) Patent No.: US 8,567,911 B2
(45) Date of Patent: Oct. 29, 2013

(54) SILICON INTERPOSER FOR MEMS SCALABLE PRINTING MODULES

(75) Inventors: Peter J. Nystrom, Webster, NY (US); Donald J. Drake, Rochester, NY (US)

(73) Assignee: Xerox Corporation, Norwalk, CT (US)

( * ) Notice: Subject to any disclaimer, the term of this patent is extended or adjusted under 35 U.S.C. 154(b) by 274 days.

(21) Appl. No.: 12/763,423

(22) Filed: Apr. 20, 2010

(65) Prior Publication Data

US 2011/0254897 A1 Oct. 20, 2011

(51) Int. Cl.
*B41J 2/14* (2006.01)
*B41J 2/16* (2006.01)
*H01L 21/00* (2006.01)

(52) U.S. Cl.
USPC ................................................ 347/47; 438/21

(58) Field of Classification Search
USPC ................................................ 347/47; 438/21
See application file for complete search history.

(56) References Cited

U.S. PATENT DOCUMENTS 5,087,930 A * 2/1992 Roy et al. ........................ 347/85
5,581,861 A * 12/1996 Lee et al. ..................... 29/25.35
2009/0256891 A1* 10/2009 Anderson et al. ............... 347/61

FOREIGN PATENT DOCUMENTS

WO WO 2009088510 A1 * 7/2009

OTHER PUBLICATIONS

Definition of Interposer, Free Dictionary Online, definition 1.*

* cited by examiner

*Primary Examiner* — Lisa M Solomon
(74) *Attorney, Agent, or Firm* — MH2 Technology Law Group LLP

(57) ABSTRACT

A print module and a method of forming the same, the print module including a substrate, an ink jet die, and an interposer between the substrate and the ink jet die. The substrate includes an ink channel and an air vent, and the die includes a plurality of ink apertures. The interposer includes etched openings therein of a truncated pyramid shape; the openings of the interposer reconfiguring the ink channel and air vent passages between the substrate and die to allow for greater tolerance in alignment and manufacture of the print head module.

7 Claims, 4 Drawing Sheets

SILICON INTERPOSER FOR MEMS SCALABLE PRINTING MODULES

DESCRIPTION OF THE INVENTION

1. Field of the Invention

This invention relates generally to imaging and, more particularly, to a printhead module having an interposer to redirect air and fluid in the print head module while maintaining an impermeable seal between components of the printhead module.

2. Background of the Invention

Micro electromechanical (MEMS)-based printing modules eject ink, via an actuator, from one or many silicon die in a MEMSJet printhead. To minimize crosstalk between actuators, the silicon die must provide an individual ink supply for each actuator. A common ink channel in a substrate below the die supplies ink to individual inlets of the MEMS die, and it is this interface that presents a challenge. Furthermore, the MEMS die requires venting air beneath a membrane of the actuator to atmosphere, so a bond of the die must fluidically seal the common air vent to the substrate as well. Specifically, it is the vent and inlet size and location on the die that constrain the methods used for die attach.

Heretofore, the problem was addressed by carefully controlling epoxy die attach pattern thickness and geometry, which often compromised assembly yield in MEMSJet printheads. The epoxy plugged ink inlets, even with controlled patterning of the epoxy. Particularly in a scalable production package design with multiple die, it is significant to eliminate ink inlet yield clogging in order to improve the scalability of MEMSJet technology.

It would, therefore, be desirable to overcome the deficiencies of an epoxy die attach pattern currently used to provide a seal between a substrate and MEMS die of an ink jet printhead.

SUMMARY OF THE INVENTION

According to various embodiments, the present teachings include a print module. The print module can include a substrate, the substrate including an ink channel and an air vent; an ink jet die mounted on the substrate, the die comprising a plurality of ink apertures; and an interposer positioned between the substrate and die, the interposer including etched openings, and the interposer defining reconfigured ink channel and air vent passages between the substrate and die.

According to various embodiments, the present teachings include a method of forming a printer module. The method can include etching an interposer wafer to define passages therethrough; adhering an interposer wafer to a MEMS wafer; dicing the adhered interposer wafer and MEMS wafer into a plurality of ink jet die; and mounting the ink jet die to a substrate.

According to various embodiments, the present teachings include a method of forming a printer module. The method can include etching an interposer wafer to define passages therethrough; dicing the interposer wafer to form a plurality of interposer die; adhering an interposer die to a MEMS die, wherein the interposer die comprises a larger footprint than the MEMS die; and adhering the interposer die to a substrate.

Additional advantages of the invention will be set forth in part in the description which follows, and in part will be learned by practice of the invention. The advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate several embodiments of the invention and together with the description, serve to explain the principles of the invention.

It should be noted that some details of the figures have been simplified and are drawn to facilitate understanding of the embodiments rather than to maintain strict structural accuracy, detail, and scale.

DESCRIPTION OF THE EMBODIMENTS

Reference will now be made in detail to the present embodiments (exemplary embodiments), examples of which are illustrated in the accompanying drawings. Wherever possible, the same reference numbers will be used throughout the drawings to refer to the same or like parts. In the following description, reference is made to the accompanying drawings that form a part thereof, and in which is shown, by way of illustration, specific exemplary embodiments in which the present teachings may be practiced. These embodiments are described in sufficient detail to enable those skilled in the art to practice the invention and it is to be understood that other embodiments may be utilized and that changes may be made without departing from the scope of the present teachings. The following description is, therefore, merely exemplary.

Figure 1A:
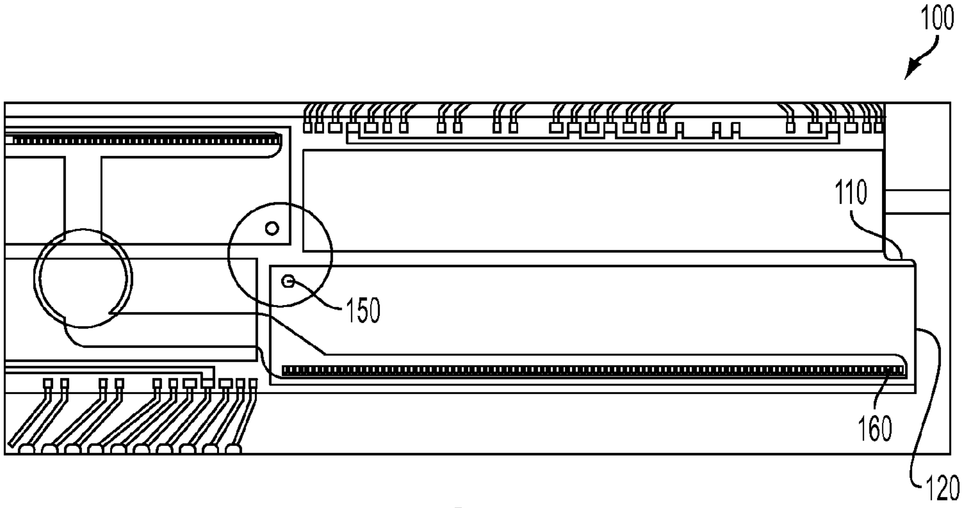
FIG. 1A PRIOR ART
FIG. 1A is a top plan view of a conventional die module.
Figure 1B:
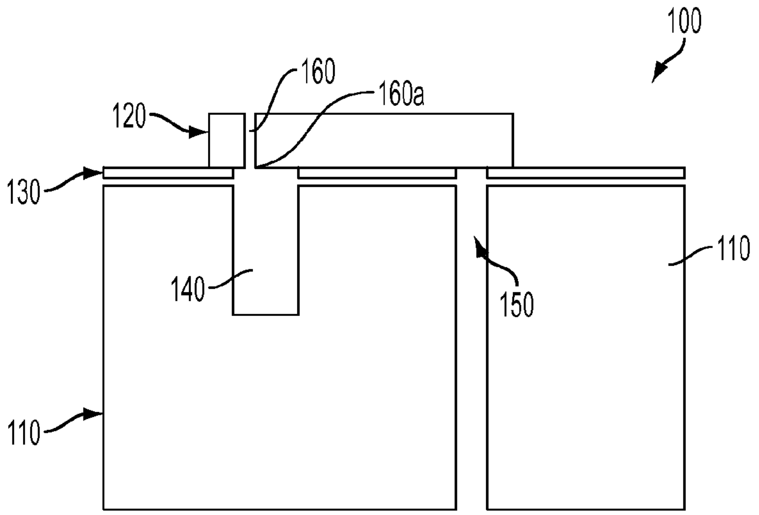
FIG. 1B PRIOR ART
FIG. 1B is a side view of the die module of FIG. 1A.

FIGS. 1A and 1B depict a conventional die module 100, from a top and side view, respectively.

As shown in FIGS. 1A and 1B, the die module 100 can include a substrate 110, a die 120 mounted on the substrate 110, and a die attach 130 positioned between the substrate 110 and die 120 to provide a seal therebetween.

The substrate 110 can include an ink channel 140 and an air vent 150. The die 120 can include an ink passages 160, an inlet 160*a* of the ink passage 160 supplied with ink from the ink channel 140 in the substrate 110.

The substrate 110 also includes a fluid path (not shown) connecting an ink reservoir to the ink channel 140 to supply the ink channel with ink. Similarly, the air vent 150 is routed through the substrate 110 to an end which is open to atmosphere. As shown in FIG. 1A, an array of small holes representing the ink passages 160 are very close to the edge of the die 120. In FIG. 1B, a die attach layer 130 is depicted. The die attach 130 can include an epoxy die attach, applied with a carefully controlled pattern, thickness, and geometry. The die can further be mounted with an epoxy combined with an additional film, such as a polyimide or an adhesive film having a coated polyimide, for example. The die attach with combined materials is likewise applied with a carefully controlled pattern, thickness, and geometry.

With reference to FIGS. 1A and 1B, it will be appreciated that it is not trivial to move the ink inlets 160 away from the edge of the die 120 because they are constrained by internal design requirements. It is not practical to add additional silicon at the edges of the die 120, because the size of the die and the wafer yield are directly proportional to the cost. The die 120 can be placed accurately onto the substrate 110, within a few microns, but the manufacturing tolerance of the substrate itself can lead to tolerance stackups at this interface between the die and substrate.

Figure 2:
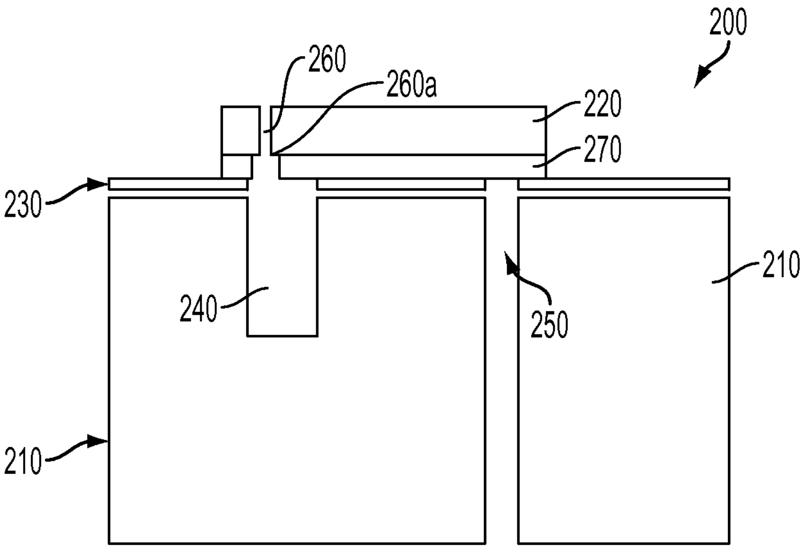
FIG. 2 is a side view of an exemplary die module in accordance with the present teachings.

FIG. 2 depicts an exemplary die module 200, including an exemplary interposer 270 in accordance with the present teachings. The exemplary die module 200 can be used, for example, in an ink jet printer. It should be readily apparent to one of ordinary skill in the art that the die module 200 depicted in FIG. 2 represents a generalized schematic illustration and that other components can be added or existing components can be removed or modified.

As shown in FIG. 2, the die module 200 can include substrate 210, a die 220 mounted on the substrate 210, a die attach 230 positioned between the substrate 210 and die 220 to provide a seal therebetween, and an interposer 270 positioned between the substrate 210 and die 220.

The substrate 210 can include an ink channel 240 and an air vent 250. The die 220 can include an ink passage 260, an inlet 260*a* of the ink passage 260 supplied with ink from the ink channel 240 in the substrate 210.

The substrate 210 can also include a fluid path (not shown) connecting an ink reservoir to the ink channel 240 to supply the ink channel with ink. Similarly, the air vent 250 can be routed through the substrate 210 to an end which is open to atmosphere. As shown in this figure, the array of small holes representing the ink passages 260 are very close to the edge of the die 220.

The die 220 can include an electrostatically actuated (e.g. MEMSJet) die as known in the art. By way of example (but not depicted in detail), the MEMSJet die can include an electrostatically actuated membrane formed on a silicon wafer. A nozzle plate can be formed over the membrane, forming a fluid pressure chamber between the nozzle plate and membrane, and include nozzle holes through which ink is ejected. The membrane can be an electrostatically actuated diaphragm, in which the membrane is controlled by an electrode. The membrane can be made from a structural material such as polysilicon, as is typically used in a surface micromachining process. An actuator chamber between membrane and wafer can be formed using typical techniques, such as by surface micromachining. The membrane is initially pulled-down by an applied voltage or current. Fluid fills in the volume created by the membrane deflection. When a bias voltage or charge is eliminated, the membrane relaxes, increasing the pressure in the fluid pressure chamber. As the pressure increases, fluid is forced out of the nozzle as discrete fluid drops.

The interposer 270 can include a manufactured wafer of a dimension substantially equal to or greater than an outer dimension of the die 220. As used herein, the term "interposer" refers to a low cost wafer configured to redirect fluid and/or air between ports (i.e. the ink channel 240) of the substrate 210 and the die 220 (i.e. inlets 260). This allows a precise seal for the air vent 250 and ink inlets 260 while allowing each to maintain the ability to pass fluid (i.e. air and ink) between the die 220 and substrate 210. The interposer 270 can be fabricated out of silicon and bonded to the MEMS wafer 220 at a wafer scale with epoxy, adhesive, or by other means. By providing this port redirection, substrate feature sizes and tolerances can be reduced, thereby saving cost and improving yield. Additionally, the option of allowing for larger ink feed structures can improve the fluid dynamics of the system allowing for performance improvements. Individual ink inlets improve crosstalk performance, but high speed printing demands the ability to feed large volumes of ink at low pressure drop. The exemplary interposer 270 defines an interface which can accomplish the desired fluid and air feed paths while maintaining a precise seal between components.

The die attach 230 can be applied to a surface of the substrate 210, between the substrate 210 and the interposer 270. The die attach 230 can include an epoxy or adhesive film or film combined with epoxy.

Figure 3A:
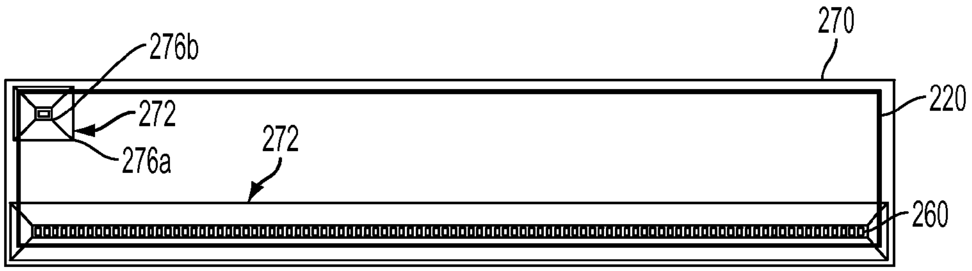
FIG. 3A is a top plan view depicting an exemplary interposer in the exemplary die module in accordance with the present teachings.
Figure 3B:
FIG. 3B is a side view of the exemplary die module of FIG. 3A, in accordance with the present teachings.

FIGS. 3A and 3B are a top plan view and side view, respectively, depicting further detail of an exemplary die 220 and interposer 270, in accordance with the present teachings. It should be readily apparent to one of ordinary skill in the art that the combined structure depicted in FIGS. 3A and 3B represent generalized schematic illustrations and that other components can be added or existing components can be removed or modified.

The combined die 220 and interposer 270 structures of FIGS. 3A and 3B are provided to depict an exemplary relationship of the die 220 and interposer 270. In this exemplary embodiment, outer dimensions of the interposer 270 are larger than outer dimensions of the MEMS die 220. By configuring the interposer 270 to be larger than the die 220, a narrower opening 272 of an etched interposer 270 can be aligned with inlets 260 of the MEMS die 220, and an advantageous fluid flow can be achieved where a funneling effect of etched walls of the interposer 270 defines a direction of flow. Because the interposer die 270 is larger than the MEMS die 220, a separate die attach operation is required. Even so, this die placement can be done accurately and the interposer die 270 can correct any tolerance mismatch of the die 220 with the machined substrate 210.

As seen in each of FIGS. 3A and 3B, the interposer 270 can have a characteristic shape. In certain embodiments, the shape of the interposer 270 can be a rectangular or square block, with one or more etched regions 272 of a rectangular or block shape, each etched region 272 having an inside dimension of a truncated trapezoid, essentially forming a hopper with a wider opening at the ink supply 240 and a narrower opening at the die inlets 260. More specifically, in the interposer, the one or more etched regions 272 can include side walls 276 defining a fluid passage with a narrower opening 276*a* at a die 220 interface angled to a wider opening 276*b* at a substrate 210 interface. It will be appreciated that the corresponding interposer 270 in FIG. 2 is depicted without the tapered side walls 276, as FIG. 2 is intended to correspond to the configuration of FIGS. 4A and 4B as described further below. With this characteristic configuration of the etched areas 272, ink can be funneled from the ink supply 240 to the ink inlets 260. This shape can be obtained by means of, for example, an anisotropic etch, as shown by way of example in FIG. 5.

Figure 4A:
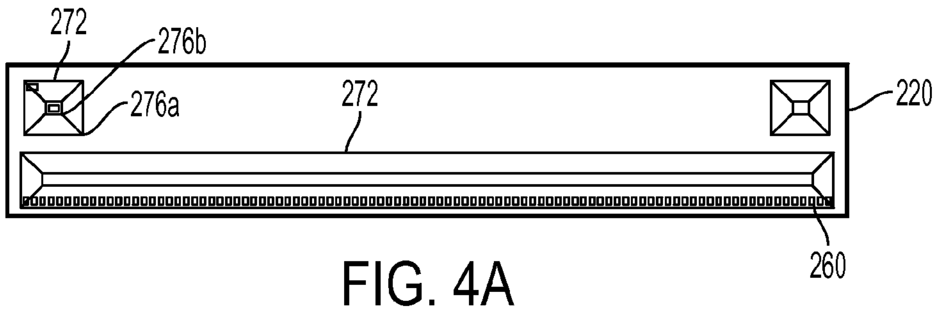
FIG. 4A is a top plan view depicting an exemplary interposer in the die module in accordance with the present teachings.
Figure 4B:
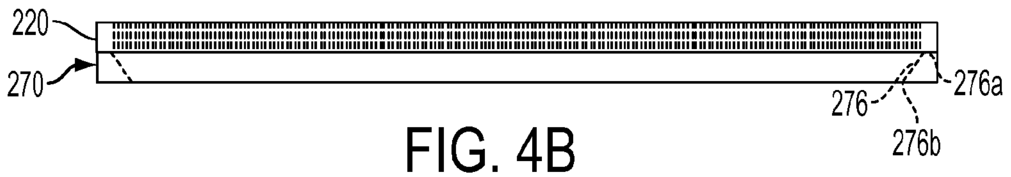
FIG. 4B is a side view of the exemplary die module of FIG. 4A, in accordance with the present teachings.
Figure 5:
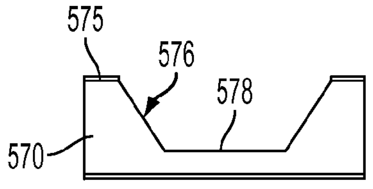
FIG. 5 is a side view of an exemplary anisotropic silicon etch of an interposer in accordance with aspects of the present teachings.

In general, referring to FIG. 5, an interposer silicon wafer 570 can be masked 575 and etched in a bulk process to create an interposer component that spreads and relocates the ink and air feed structures. Anisotropic etches using KOH (potassium hydroxide) or TMAH (tetramethylammonium hydroxide) are well known in silicon processing and provide very accurate etched structures in silicon. The etch takes advantage of etch selectivity along the crystalline planes in silicon to render the exemplary shape in which sloped side walls 576 taper to a planar floor 578. As depicted ultimately in FIGS. 3A through 4B, the etch can terminate on the far side of the interposer, leaving a hole once the mask is removed, and the "floor" 578 will be gone. Apertures can be formed in the interposer 270.

FIGS. 4A and 4B are a top plan view and side view, respectively, depicting further detail of an exemplary die 220 and interposer 270, in accordance with the present teachings. It should be readily apparent to one of ordinary skill in the art that the combined structure depicted in FIGS. 4A and 4B represent generalized schematic illustrations and that other components can be added or existing components can be removed or modified.

The combined die 220 and interposer 270 structures of FIGS. 4A and 4B are provided to depict an exemplary relationship of the die 220 and interposer 270. In this exemplary embodiment, the interposer 270 is the same size (e.g. of substantially the same outer dimension) as the MEMS die 220.

By configuring the interposer 270 to be the same size as the die 220, an etched interposer wafer 270 can be bonded to the MEMS wafer 220 at the wafer level, and then diced into individual parts. The configuration also moves inlet structures away from the edges of the die, dramatically improving die bond sealing yield. The difference in shape of the side walls of the interposer passages is that the side walls and hence ink restriction is inverted, however, the cross sectional area is not impaired and the final slit opening can be managed by balancing the size of the etched trench along with the thickness of the interposer wafer.

The interposer 270 depicted in FIGS. 4A and 4B can have a trapezoidal hopper shape, reflecting the silicon crystal planes in which side walls 276 of fluid passages have a wider opening 276*a* at a die 220 interface relative to a narrower opening 276*b* at a substrate 210 interface. This shape can be obtained by means of an anisotropic etch, again as shown by way of example in FIG. 5.

In each exemplary embodiment, by adding a low cost etched silicon interposer wafer 270 to the bottom of a more expensive MEMS wafer 220, high precision features can be effectively sealed removing constraints from further MEMS design optimization. In addition, manufacturing packaging yield can be improved, further reducing cost.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising." The term "at least one of" is used to mean one or more of the listed items can be selected.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume values as defined earlier plus negative values, e.g. −1, −1.2, −1.89, −2, −2.5, −3, −10, −20, −30, etc.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A print module comprising:

a substrate comprising an ink channel and an air vent;

an ink jet semiconductor die comprising a plurality of ink apertures that extend through the ink jet semiconductor die and a die footprint; and a silicon interposer comprising an interposer footprint, a first silicon surface attached to the substrate, and a second silicon surface attached to the ink jet semiconductor die, wherein the second silicon surface is opposite the first silicon surface and the silicon interposer is positioned between the substrate and the ink jet semiconductor die, the silicon interposer further comprising a plurality of openings therethrough, wherein one of the openings through the silicon interposer comprises angled sidewalls, a first orifice having a first width at one of the first silicon surface and the silicon second surface, and a second orifice having a second width wider than the first width at the other of the first silicon surface and the second silicon surface, wherein the one of the openings provides an ink path from the substrate ink channel to the plurality of ink apertures through the ink jet semiconductor die, wherein the interposer footprint is less than or equal to the die footprint.

2. The print module of claim 1, wherein the interposer footprint is the same size as the die footprint.

3. The print module of claim 1, wherein the interposer footprint is smaller than the die footprint.

4. The print module of claim 1, wherein the one of the openings through the silicon interposer, in cross section, comprises a truncated pyramid shape formed by the sidewalls, the first orifice, and the second orifice.

5. The print module of claim 1, wherein the silicon interposer relocates the ink channel and the air vent.

6. The print module of claim 1, further comprising a first die attach between the silicon interposer and the substrate that attaches the first silicon surface of the silicon interposer to the substrate and a second die attach between the silicon interposer and the ink jet semiconductor die that attaches the second silicon surface of the interposer to the ink jet semiconductor die.

7. The print module of claim 1, wherein the silicon interposer is a single layer of silicon comprising a silicon wafer that comprises a first substrate interface and an ink semiconductor die interface, and wherein the first substrate interface corrects any tolerance mismatch between the plurality of apertures through the ink jet semiconductor die and the ink channel in the first substrate interface.

* * * * *